US009124275B2

(12) United States Patent
Santo et al.

(10) Patent No.: US 9,124,275 B2
(45) Date of Patent: Sep. 1, 2015

(54) TOUCH PANEL

(71) Applicant: PANASONIC CORPORATION, Osaka (JP)

(72) Inventors: Kouichi Santo, Osaka (JP); Hideaki Eto, Fukui (JP); Takuma Besshi, Osaka (JP); Tsutomu Yahagi, Osaka (JP)

(73) Assignee: PANASONIC INTELLECTUAL PROPERTY MANAGEMANT CO.,LTD., Osaka (JP)

( * ) Notice: Subject to any disclaimer, the term of this patent is extended or adjusted under 35 U.S.C. 154(b) by 321 days.

(21) Appl. No.: 13/768,927

(22) Filed: Feb. 15, 2013

(65) Prior Publication Data

US 2013/0228441 A1 Sep. 5, 2013

(30) Foreign Application Priority Data

Mar. 5, 2012 (JP) .................................. 2012-047631

(51) Int. Cl.
*G06F 3/041* (2006.01)
*H01H 13/02* (2006.01)
*H03K 17/96* (2006.01)
*G06F 3/044* (2006.01)
*G06F 3/0354* (2013.01)

(52) U.S. Cl.
CPC .......... *H03K 17/962* (2013.01); *G06F 3/03547* (2013.01); *G06F 3/041* (2013.01); *G06F 3/044* (2013.01)

(58) Field of Classification Search
CPC ....... G06F 3/041; G06F 3/044; H03K 17/962; H01H 13/702–13/705
USPC .......................................... 200/600, 512–514
See application file for complete search history.

(56) References Cited

U.S. PATENT DOCUMENTS 8,101,880 B2 * 1/2012 Kaps et al. ..................... 200/600
2009/0091549 A1 4/2009 Matsumoto et al.
2012/0313887 A1 * 12/2012 Chen et al. ..................... 345/174

FOREIGN PATENT DOCUMENTS

JP 2009-093397 A 4/2009
JP 2010-244336 A 10/2010

* cited by examiner

*Primary Examiner* — Amy Cohen Johnson
*Assistant Examiner* — Marina Fishman
(74) *Attorney, Agent, or Firm* — McDermott Will Emery LLP

(57) ABSTRACT

A touch panel includes a transparent plate, an upper substrate having an upper surface situated on a lower surface of the transparent plate and stacked on the transparent plate in a downward direction, an upper conductive layer provided between the lower surface of the transparent plate and the lower surface of the upper substrate, a lower substrate having an upper surface situated on the lower surface of the upper substrate and stacked on the upper substrate in the downward direction, and a lower conductive layer provided between the lower surface of the upper substrate and the upper surface of the lower substrate and facing the upper conductive layer across the upper substrate. The upper surface of the transparent plate has a dome shape projecting upward on a cross section in a first direction perpendicular to the downward direction and on a cross section in a second direction perpendicular to the downward direction and the first direction. The lower surface of the transparent plate is concave upward on the cross section in the first direction is straight on the cross section in the second direction. The touch panel can be easily manufactured and reliably operated.

8 Claims, 5 Drawing Sheets

TOUCH PANEL

RELATED APPLICATIONS

This application claims the benefit of Japanese Application No. 2012-047631, filed on Mar. 5, 2012, the disclosures of which Applications are incorporated by reference herein.

FIELD OF THE INVENTION

The present invention relates to a touch panel mainly used in operation of various electronic devices.

BACKGROUND OF THE INVENTION

In recent years, with advance in functionality and diversification of various electronic devices such as mobile phones or car navigation systems, in many electronic devices, light-transmitting touch panels are mounted on front surfaces of display elements such as liquid crystal display elements, and operators operate the devices by touching the touch panels with her/his fingers or the like while viewing displays of display elements on rear surfaces through the touch panels to switch various functions of the devices. There is a demand for electronic devices that can be easily used and reliably operated.

FIG. 4 is an exploded perspective view of conventional touch panel 500. Upper substrate 1 is a film-like light-transmitting substrate having substantially a rectangular shape. Light-transmitting almost-strip-shaped upper conductive layers 2 made of, e.g. indium tin oxide are arranged in forward and backward directions on an upper surface of upper substrate 1. Ends of upper electrodes 3 are connected to respective one of ends of upper conductive layers 2, and other ends of upper electrodes 3 extend to a right end of a periphery of upper substrate 1. Upper electrode 3 is made of conductive material, such as silver or carbon.

Lower substrate 4 is a film-like light-transmitting substrate having an almost rectangular shape. Light-transmitting almost-strip-shaped lower conductive layers 5 made of, e.g. indium tin oxide are arranged on an upper surface of lower substrate 4 in a lateral direction perpendicular to upper conductive layers 2. Ends of lower electrodes 6 are connected to ends of lower conductive layers 5, respectively, and respective other ends of lower electrodes 6 extend to a right end of a periphery of lower substrate 4. Lower electrode 6 is made of conductive material, such as silver or carbon.

Transparent plate 7 is made of insulating resin, has substantially a rectangular shape, and is light-transmittable. A center portion on the upper surface of transparent plate 7 having substantially a dome shape projects upward, thus having convex part 7A having a curved surface in forward and backward directions and a curved surface in lateral directions is formed on an upper surface of transparent plate 7. Transparent plate 7 has a flat lower surface. Transparent plate 7 is stacked on the upper surface of upper substrate 1, and upper substrate 1 is stacked on the upper surface of lower substrate 4. The substrates and the plate are bonded to each other with an adhesive agent, thereby providing touch panel 500.

Touch panel 500 is disposed on a front surface of a display element, such as a liquid crystal display, to be installed into an electronic device. Upper electrodes 3 and lower electrodes 6 extending to the right end of the periphery of the touch panel 500 are electrically connected to the electronic circuit of the electronic device with a flexible wiring board and a connector.

While a voltage is applied sequentially from the electronic circuit to upper electrodes 3 and lower electrodes 6, when an operator touches the upper surface of transparent plate 7 with her/his finger according to a display of the display element, an electric capacitance between upper conductive layer 2 and lower conductive layer 5 changes at a touched position. The electronic circuit detects the position based on the change of the capacitance, and switches various functions of the electronic device.

For example, while plural menus are displayed on the display element, when an operator touches the upper surface of transparent plate 7 on a desired menu with her/his finger, an electric charge is lead to the finger to change a capacitance between upper conductive layer 2 and lower conductive layer 5 at the touched position on the touch panel. The electronic circuit detects the change of the capacitance to select of the desired menu.

SUMMARY OF THE INVENTION

A touch panel includes a transparent plate, an upper substrate having an upper surface situated on a lower surface of the transparent plate and stacked on the transparent plate in a downward direction, an upper conductive layer provided between the lower surface of the transparent plate and the lower surface of the upper substrate, a lower substrate having an upper surface situated on the lower surface of the upper substrate and stacked on the upper substrate in the downward direction, and a lower conductive layer provided between the lower surface of the upper substrate and the upper surface of the lower substrate and facing the upper conductive layer across the upper substrate. The upper surface of the transparent plate has a dome shape projecting upward on a cross section in a first direction perpendicular to the downward direction and on a cross section in a second direction perpendicular to the downward direction and the first direction. The lower surface of the transparent plate is concave upward on the cross section in the first direction is straight on the cross section in the second direction.

The touch panel can be easily manufactured and reliably operated.

DETAILED DESCRIPTION OF PREFERRED EMBODIMENT

Figure 1A:
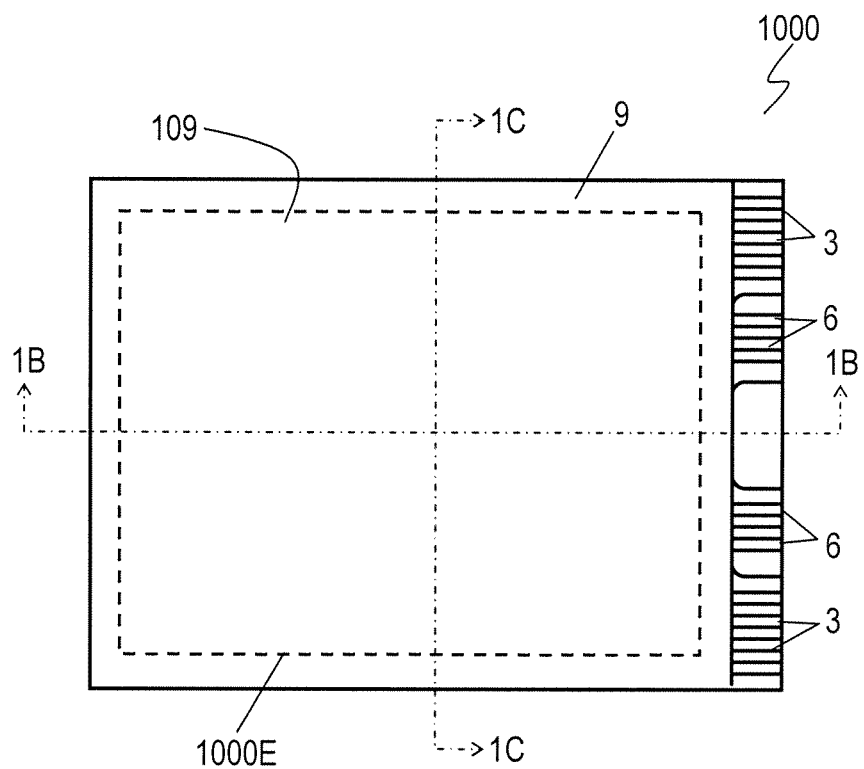
FIG. 1A is a top view of a touch panel according to an exemplary embodiment.
Figure 1B:
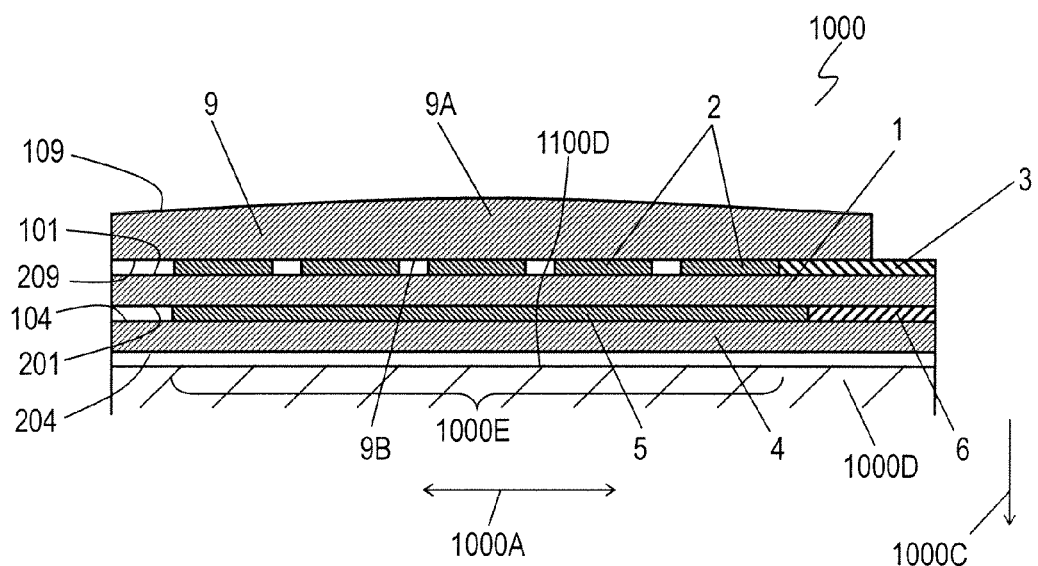
FIG. 1B is a cross-sectional view of the touch panel along line 1B-1B shown in FIG. 1A.
Figure 1C:
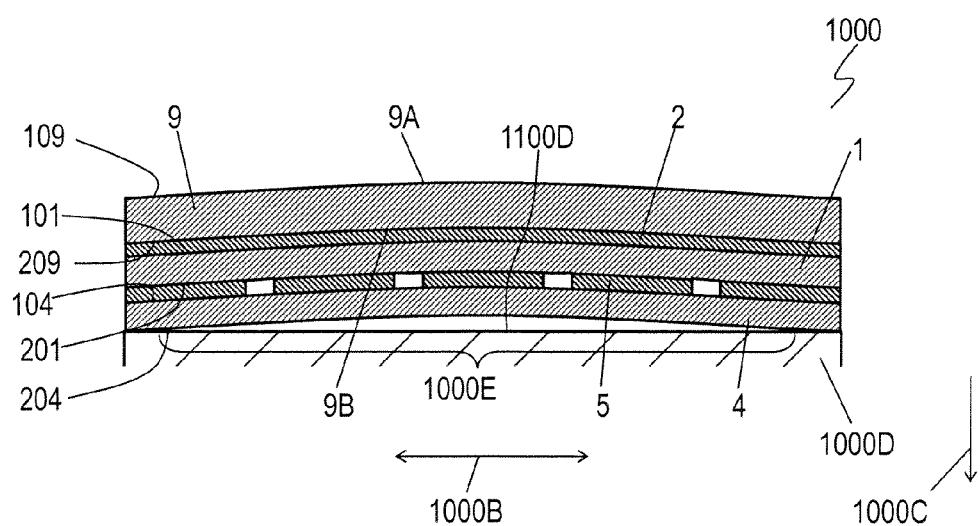
FIG. 1C is a cross-sectional view of the touch panel along line 1C-1C shown in FIG. 1A.
Figure 2:
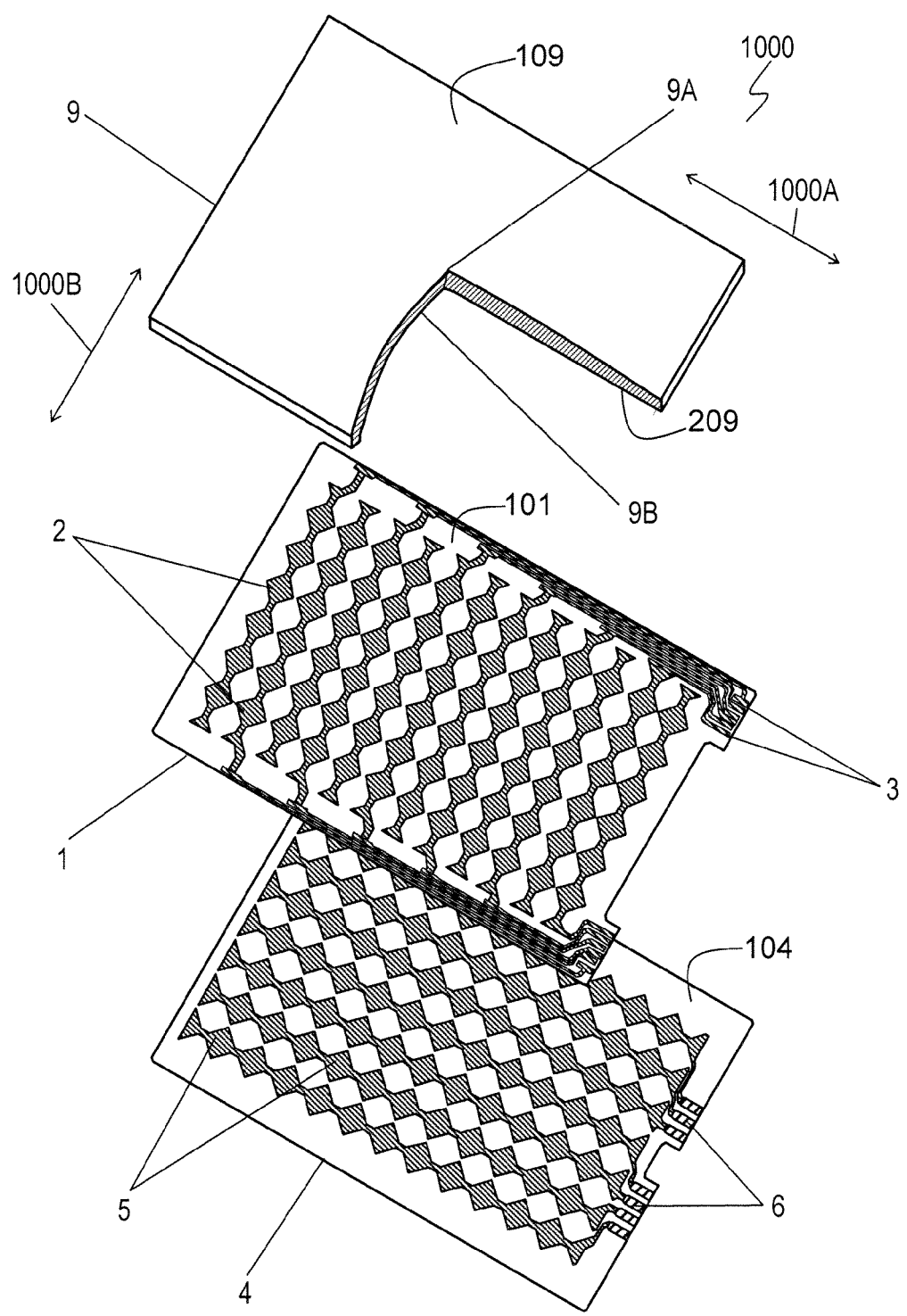
FIG. 2 is an exploded perspective view of the touch panel according to the embodiment.

FIG. 1A is a top view of touch panel 1000 according to an exemplary embodiment. FIG. 1B is a cross-sectional view of the touch panel along line 1B-1B shown in FIG. 1A. FIG. 1C is a cross-sectional view of the touch panel along line 1C-1C shown in FIG. 1A. FIG. 2 is an exploded perspective view of touch panel 1000. Touch panel 1000 includes transparent plate 9, upper substrate 1, upper conductive layers 2, lower substrate 4, and lower conductive layers 5. Transparent plate 9 has upper surface 109 and lower surface 209. Upper substrate 1 has lower surface 201 and upper surface 101 situated on lower surface 209 of transparent plate 9, and is stacked on transparent plate 9 in downward direction 1000C. Upper conductive layer 2 is provided between lower surface 209 of transparent plate 9 and upper surface 101 of upper substrate 1. Upper substrate 4 has lower surface 201 and upper surface 104 situated on lower surface 201 of upper substrate 1, and is stacked on upper substrate 1 in downward direction 1000C. Lower conductive layer 5 is provided between lower surface 201 of upper substrate 1 and upper surface 104 of lower substrate 4, and faces upper conductive layer 2 across upper substrate 1.

Upper substrate 1 is a light-transmitting substrate having substantially a rectangular shape, and is a film made of, e.g. polyethylene terephthalate, polyethersulfone, or polycarbonate. Upper conductive layers 2 are made of light-transmittable conductive material, such as indium tin oxide or tin oxide, formed by, e.g. a sputtering method. Upper conductive layers 2 are arranged in direction 1000A perpendicular to downward direction 1000C and have substantially strip shapes. Each of one ends of upper electrodes 3 made of conductive material, such as copper, silver, or carbon, is connected to respective one of ends of upper conductive layers 2, while another end of each of upper electrodes 3 extends to a right end of a periphery of upper substrate 1.

Lower substrate 4 is made of the same film as the upper substrate, has substantially a rectangular shape, and is light-transmittable. Lower conductive layers 5 are made of light-transmittable conductive material, such as indium tin oxide or tin oxide. Lower electrodes 5 have substantially strip shapes, and are arranged in direction 1000B perpendicular to directions 1000A and 1000C. Each of one ends of lower electrodes 6 is connected to respective one of ends of lower conductive layer 5, while another end of each of lower electrodes 6 extends to a right end of a periphery of lower substrate 4.

Each of upper conductive layers 2 has plural square portions connected to each other in direction 1000B, while gaps having substantially squire shapes are formed between the square portions. Each of lower conductive layers 5 has plural square portions connected to each other in direction 1000A, while gaps having substantially square shapes are formed between the square portions. While upper substrate 1 is stacked on lower substrate 4, the square portions of upper conductive layers 2 overlap the square gaps of lower conductive layers 5, and the gaps of upper conductive layers 2 overlap the square portions of lower conductive layers 5.

Transparent plate 9 is made of insulating resin, such as polycarbonate or acrylic resin, has substantially a rectangular shape, and is light-transmittable. Upper surface 109 of transparent plate 9 has a center portion having convex part 9A which projects upward to have a dome shape having a curved surface in forward and backward directions and a curved surface in lateral directions. Lower surface 209 of transparent plate 9 has concave part 9B having substantially a cylindrical surface shape curving in only one of directions 1000A and 1000B.

The curvature radius and the curving direction of concave part 9B are identical to a smaller curvature radius out of curvature radiuses of convex part 9A in directions 1000A and 1000B and the curving direction having the smaller curvature radius, respectively. According to the embodiment, the curvature radius of the cross section of convex part 9A in direction 1000B is 1000 mm, and the curvature radius of the cross section of convex part 9A in direction 1000A is 2000 mm. Concave part 9B curves at a curvature radius of 1000 mm on the cross section thereof in direction 1000B and is straight on the cross section thereof in direction 1000A.

Upper surface 109 of transparent plate 9 has a dome shape projecting upward on a cross section thereof in direction 1000A perpendicular to downward direction 1000C and on a cross section thereof in direction 1000B perpendicular to downward direction 1000C and direction 1000A. Lower surface 209 of transparent plate 9 is concave upward on the cross section thereof in direction 1000B, and is straight on the cross section thereof in direction 1000A, thus having substantially a cylindrical surface shape.

Figure 3:
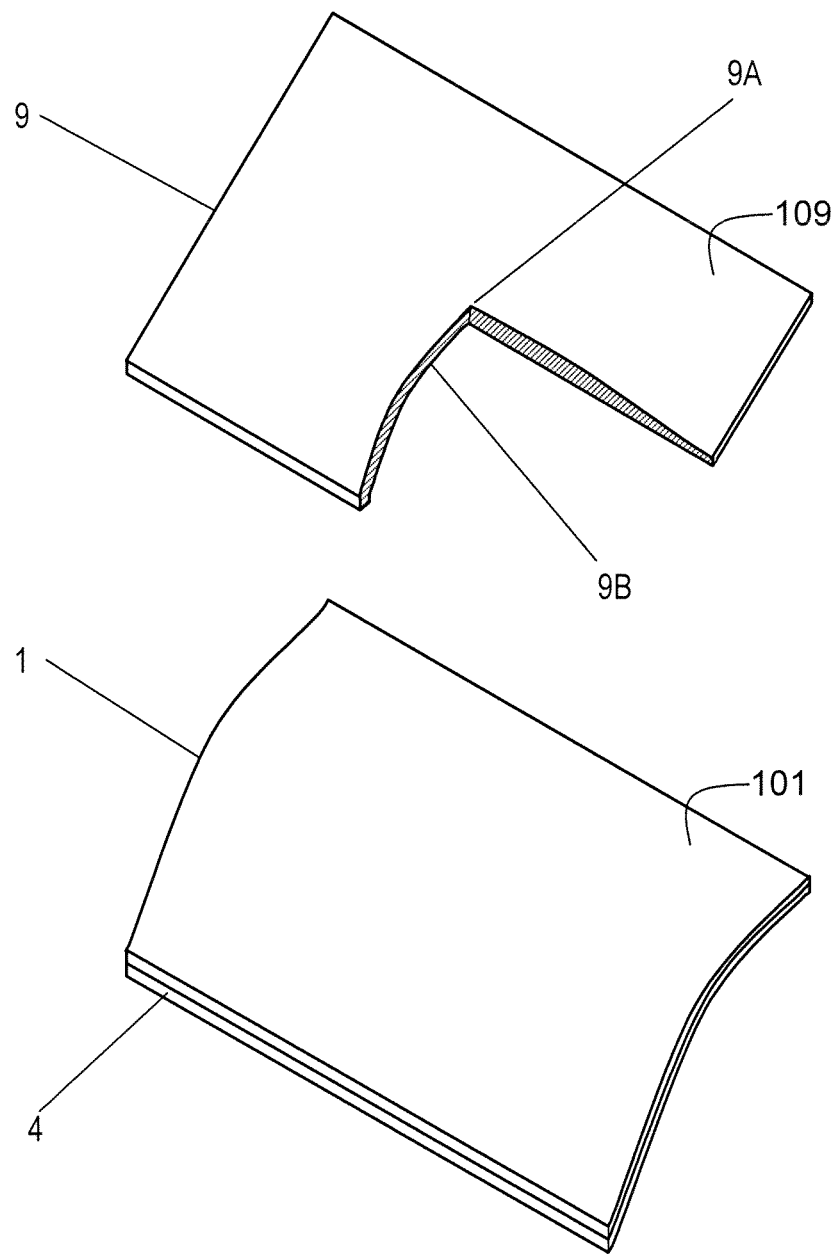
FIG. 3 is a perspective view of the touch panel according to the embodiment.

Transparent plate 9 is situated on upper surface 101 of upper substrate 1, and upper substrate 1 is situated on upper surface 104 of lower substrate 4. The substrates and the plate are bonded to each other with adhesive agent, such as various acrylic resins or rubber cements. FIG. 3 is an exploded perspective view of touch panel 1000. As shown in FIG. 3, upper substrate 1 and lower substrate 4 contact concave part 9B of lower surface 209 of transparent plate 9 securely, curve in direction 1000B to have substantially a cylindrical surface shape, and bonded to provide touch panel 1000.

Transparent plate 9 has substantially a rectangular shape having short sides extending in direction 1000B and long sides being longer than the small side and extending in direction 1000A.

Lower surface 204 of lower substrate 4 is placed on upper surface 1100D of display element 1000D, such as a liquid crystal display, thus allowing touch panel 1000 to be installed to an electronic device. Upper electrodes 3 and lower electrodes 6 extending to the right end of the periphery of the touch panel are electrically connected to an electronic circuit of the electronic device via a flexible wiring board or connectors.

While a voltage is applied from the electronic circuit sequentially to upper electrodes 3 and lower electrodes 6, an operator have a finger touch upper surface 109 of transparent plate 9 according to an image displayed on display screen 1000E on upper surface 1100D of display element 1000D. This touch changes a capacitance between upper conductive layer 2 and lower conductive layer 5 at the touched position. The electronic circuit detects the touched position based on the change, and switches various functions of the electronic device.

For example, while plural menus are displayed on display element 1000D, upon an operator having a finger touch upper surface 109 of transparent plate 9 on a desired menu, a electric charge is lead to the finger to change the capacitance between upper conductive layer 2 and lower conductive layer 5 of the touch panel at the touched position. The electronic circuit detects the change, and selects the desired menu.

Lower surface 209 of transparent plate 9 of touch panel 1000 has concave part 9B having neither a flat shape nor a dome shape and curving in only direction 1000B. Since upper substrate 1 and lower substrate 4 curving in direction 1000B to have substantially the cylindrical surface shape are airtightly bonded to concave part 9B, touch panel 1000 can be manufactured easily and operate reliably.

Concave part 9B on lower surface 209 has substantially a cylindrical surface shape having a curvature radius of 1000 mm in direction 1000B in accordance with a smaller curvature radius of the curvature radiuses in directions 1000A and 1000B of convex part 9A of upper surface 109. Since the thickness of transparent plate 9 in direction 1000B is constant, even though the operator touches the center portion of upper surface 109 of transparent plate 9 and an outer peripheral portion thereof, the same capacitance can be obtained along direction 1000B.

Concave part 9B is concave at the same curvature radius in direction 1000B in which the curvature radius of convex part 9A on upper surface 109 is smaller. This structure allows convex part 9A on upper surface 109 to have a large curvature radius, such as 2000 mm, in direction 1000A in which concave part 9B on lower surface 209 is straight. This structure reduces the difference between the thickness of the center portion and the peripheral portion of transparent plate 9 in direction 1000A, accordingly reduces an error of a change in capacitance obtained when the center portion and the peripheral portion in direction 1000A are operated. Thus, touch panel 1000 can be reliably operated.

When upper substrate 1 and lower substrate 4 are bonded to concave part 9B on lower surface 209 of transparent plate 9, upper substrate 1 and lower substrate 4 that curve upward to have cylindrical surface shapes are bonded to concave part 9B having substantially a cylindrical surface shape. This structure allows upper substrate 1 and lower substrate 4 to be easily bonded to concave part 9B on lower surface 209 of transparent plate 9 without a gap or a wrinkle by a simple method, such as smoothing with a roller.

Figure 4:
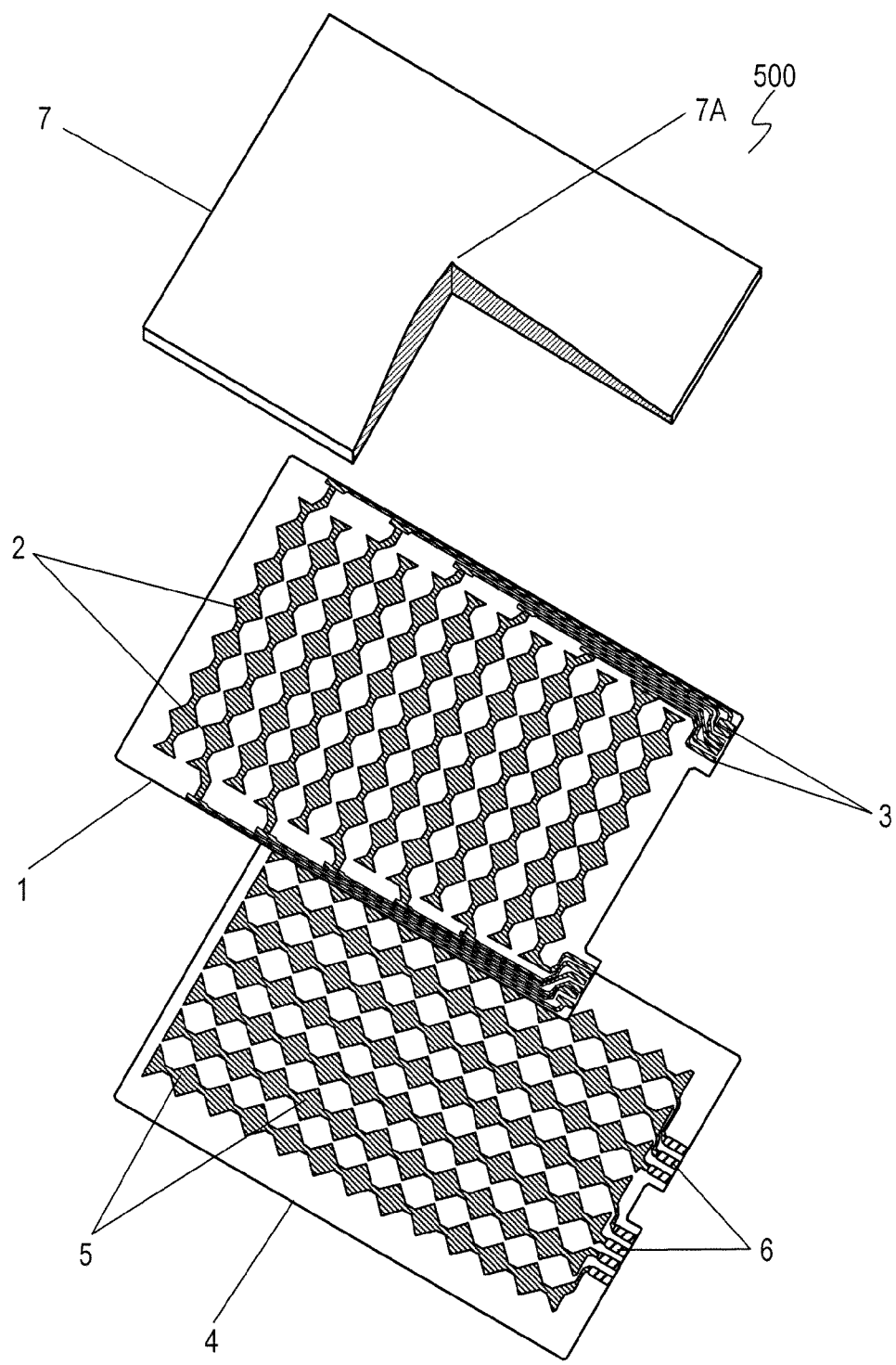
FIG. 4 is an exploded perspective view of a conventional touch panel.

In conventional touch panel 500 shown in FIG. 4, in accordance with a shape of an electronic device on which the touch panel is mounted, convex part 7A is formed on the upper surface of transparent plate 7, and the center portion projects upward to have a dome shape. Transparent plate 7 has a flat lower surface. Therefore, transparent plate 7 has different thicknesses at the center portion and the peripheral portion, and changes in capacitance between upper conductive layer 2 and lower conductive layer 5 when the upper surface of transparent plate 7 is touched with a finger are different from each other at the center portion and the peripheral portion.

When the center portion on the upper surface of transparent plate 7 is operated and when the peripheral portion is operated, a touched position is detected by the electronic circuit in consideration of the different electric capacitances, and the operations are cumbersome to tend to cause an error.

In order to address the above problem, similarly to the upper surface, the lower surface of transparent plate 7 can be concave to have a dome shape to form a concave part having curved surfaces in forward and backward directions and lateral directions. This allows the thicknesses of transparent plate 7 to be constant at the center portion and the peripheral portion. In this case, upper substrate 1 and lower substrate 4 having substantially rectangular shapes cannot be easily bonded to the concave lower surface of transparent plate 7 without a gap or a wrinkle.

In touch panel 1000 according to the embodiment, upper conductive layer 2 and lower conductive layer 5 are made of light-transmitting metal, such as indium tin oxide or tin oxide. Upper conductive layer 2 and lower conductive layer 5 can be made of insulating resin, such as light-transmitting acrylic resin, and filaments or fine particles made of silver dispersed therein.

In the embodiment, terms, such as an "upper surface", "lower surface", "upward direction", "downward direction", indicating directions indicate relative directions depending on only positional relationships of components, such as transparent plate 9, upper substrate 1, and lower substrate 4, of touch panel 1000, and do not indicate absolute directions, such as a vertical direction.

What is claimed is:

1. A touch panel comprising:
   a transparent plate having an upper surface and a lower surface;
   an upper substrate having a lower surface and an upper surface which is situated on the lower surface of the transparent plate, the upper substrate being stacked on the transparent plate in a downward direction;
   an upper conductive layer provided between the lower surface of the transparent plate and the lower surface of the upper substrate;
   a lower substrate having an upper surface situated on the lower surface of the upper substrate, the lower substrate being stacked on the upper substrate in the downward direction; and
   a lower conductive layer provided between the lower surface of the upper substrate and the upper surface of the lower substrate, the lower conductive layer facing the upper conductive layer across the upper substrate,
   wherein the upper surface of the transparent plate has a dome shape projecting upward on a cross section in a first direction perpendicular to the downward direction and on a cross section in a second direction perpendicular to the downward direction and the first direction, and
   wherein the lower surface of the transparent plate is concave upward on the cross section in the first direction and is straight on the cross section in the second direction.

2. The touch panel according to claim 1, wherein the lower surface of the transparent plate substantially has a cylindrical surface shape.

3. The touch panel according to claim 1, wherein the transparent plate substantially has a rectangular shape having short sides and long sides longer than the short sides, the short sides extending in the first direction, the second sides extending in the second direction.

4. The touch panel according to claim 1, wherein the transparent plate has a uniform thickness on the cross section of the transparent plate in the first direction.

5. The touch panel according to claim 1, wherein a curvature radius of the upper surface of the transparent plate on the cross section in the first direction is smaller than a curvature radius of the upper surface of the transparent plate on the cross section in the second direction.

6. The touch panel according to claim 1, wherein a curvature radius of the lower surface of the transparent plate on the cross section in the first direction is substantially identical to the curvature radius of the upper surface of the transparent plate on the cross section in the first direction.

7. The touch panel according to claim 6, wherein a thickness of the transparent plate in the first direction is substantially constant.

8. The touch panel according to claim 1, wherein a thickness of the transparent plate in the first direction is substantially constant.

* * * * *